United States Patent [19]

Enomoto

[11] 4,229,820

[45] Oct. 21, 1980

[54] MULTISTAGE SELECTIVE DIFFERENTIAL PULSE CODE MODULATION SYSTEM

[75] Inventor: Hajime Enomoto, Funabashi, Japan

[73] Assignee: Kakusai Denshin Denwa Kabushiki Kaisha, Tokyo, Japan

[21] Appl. No.: 928,372

[22] Filed: Jul. 27, 1978

Related U.S. Application Data

[63] Continuation-in-part of Ser. No. 781,018, Mar. 24, 1977, abandoned.

[30] Foreign Application Priority Data

Mar. 26, 1976 [JP] Japan .................................. 51-33321

[51] Int. Cl.² ............................................ H03K 13/22
[52] U.S. Cl. ............................................ 375/27; 375/28
[58] Field of Search ................ 325/38 R, 38 A, 38 B, 325/141; 178/68; 358/141, 13, 138, 135

[56] References Cited

U.S. PATENT DOCUMENTS

| | | | |
|---|---|---|---|
| 3,518,662 | 6/1970 | Nakagome | 325/38 A |
| 3,573,364 | 4/1971 | Shimamura | 325/38 B |
| 3,594,509 | 7/1971 | Shimamura | 325/38 B |
| 3,796,956 | 3/1974 | Fudemoto | 325/38 A |
| 3,829,779 | 8/1974 | Fujimoto | 325/38 A |
| 3,925,611 | 12/1975 | Dennis | 325/38 A |
| 4,010,422 | 3/1977 | Wouda | 325/141 |
| 4,021,799 | 5/1977 | Hinoshita | 325/38 B |

Primary Examiner—Benedict V. Safourek
Assistant Examiner—Michael A. Masinick
Attorney, Agent, or Firm—Robert E. Burns; Emmanuel J. Lobato; Bruce L. Adams

[57] ABSTRACT

A differential pulse code modulation system, in which an input signal is at first approximated to a stepwise waveform having level changes at a constant number n of sampling points selected in the order of level magnitude from a predetermined number N of samples in the input signal. The remainder of the above approximating operation is secondary followed-up by delta modulation, which uses a variable step level controlled in accordance with the variation feature of the remainder. The differential pulse code modulation output is provided by the above two approximating operations.

6 Claims, 17 Drawing Figures

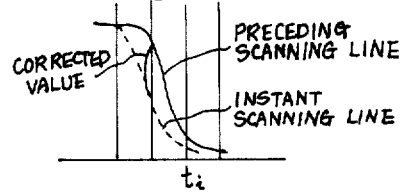
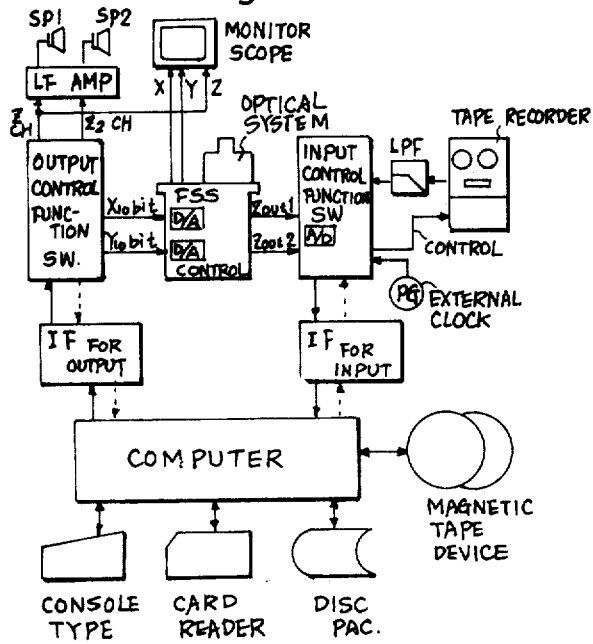

MULTISTAGE SELECTIVE DIFFERENTIAL PULSE CODE MODULATION SYSTEM

CROSS-REFERENCE TO RELATED APPLICATION

This application is a continuation-in-part of my co-pending application of Ser. No. 781,018 filed on Mar. 24, 1977 and now abandoned.

FIELD OF THE INVENTION

This invention relates to a DPCM (Differential Pulse Code Modulation) system, in which the difference between a predictive value and an input information value is coded.

BACKGROUND OF THE INVENTION

The PCM transmission system has widely been studied because of its many advantages on the picture transmission, and its typical examples are the DPCM coding system and the orthogonal transform coding method, both of which utilize the statistic property of a picture.

The DPCM method makes use of statistic and visual properties of a level variation but is considered to have a difficulty in that an abrupt level variation and a gentle slope of a picture, which are extremely different in nature from each other, are processed by a certain signal operation.

Meanwhile, the orthogonal transform coding system starts from an idea of determining an orthogonal transform in such a manner as to minimize a square mean error by a linear operation based on a correlation matrix of a picture and is the most effective with respect to a continuous Gaussian process or the like. However, a picture has a great feature in a contour portion having abrupt level variations. In this point, the orthogonal transform presents a problem.

Further, when the picture is subjected to Hadamard transform, not only Gaussian noise but also irregular movements of an oblique straight contour portion, and defocusing of a contour out of synchronization with an orthogonal function may appear in some cases, making the picture unnatural.

SUMMARY OF THE INVENTION

An object of this invention is to provide a multistage selective DPCM system which overcomes the above-said defects of the prior art and is capable of coding with less quantizing distortion which is suitable for any states of variation of input information, that is, abrupt level variations approximate to stepwise waveforms and level variations like gentleslope waveforms.

The multistage selective DPCM system of this invention is a system which achieves in a multiple stage operations of achieving DPCM on the basis of a certain selection principle in such a manner as to approximate a picture signal or like input information in the order of the magnitude of feature and further approximating the remainder of the above approximation in accordance with a standard based on its statistic property.

In accordance with this invention, there is provided a multistage selective differential pulse code modulation system comprising:

a first encoding stage for approximating an input signal to a stepwise waveform having constant n level changes at sampling points selected in the order of level magnitude from a predetermined adjacent N samples in the input signal by developing a first coded output indicative of said stepwise waveform and a remainder corresponding to a difference between said input signal and said stepwise waveform; a second encoding stage connected to said first stage for receiving said remainder to encode said remainder by delta modulation, which uses a variable step level controlled in accordance with the level variation feature of said remainder so as to provide a second coded output indicative of successive values of said variable step level of said delta modulation; and output means connected to said first stage and said second stage to send out said first coded output and said second coded output to indicate said input signal.

BRIEF DESCRIPTION OF THE DRAWINGS

The invention will be described with reference to the accompanying drawings, in which:

FIG. 11 is a diagram showing the relation between an advance of a level variation point and a corrected value;

FIGS. 12 and 13 are respectively a block diagram and a characteristic diagram showing an experimental simulation example of the method of this invention;

DETAILED DESCRIPTION OF THE INVENTION

With the present invention, it is possible to achieve a substantially constant-speed scanning of a picture and transmit its coded output within a relatively narrow band.

This invention will hereinafter be described in detail but, in order to facilitate a better understanding of the invention, a description will be given first in connection with a picture signal for use as input information to which this invention is applied.

As is well-known, the correlation function of a picture signal such as a television signal is well approximate to an exponential function in the vicinity of the origin, as follows:

$$\rho(x) = e^{-ax} \qquad (1)$$

The remainder of that portion of the correlation function which is expressed by the exponential function undergoes a small and gentle change, and this belongs to a low-frequency component in the television signal, so that a high-frequency component can be considered to be composed only of the portion expressed by the exponential function.

As regards the stochastic process in which the correlation function becomes an exponential function, the following has been well-known.

Figure 1:
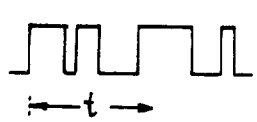
FIG. 1 is a waveform diagram showing a process of random code variation.

It is the process in which a code change follows the Poisson process, as shown in FIG. 1, that is, the stochastic process in which the probability $P_n(t)\Delta t$ that a code change occurs n times in a time interval t to $(t+\Delta t)$, is given by $$P_n(t) = e^{-at} \frac{(at)^n}{n!} \qquad (2)$$

In this case, the mean value E(t) and dispersion V(t) of the number of code changes in the time t are as follows:

$$E(t) = V(t) = at \qquad (3)$$

The correlation function $\rho(t)$ of this process becomes as follows:

$$\rho(t) = e^{-2at} \qquad (4)$$

Accordingly, the power spectrum G(f) becomes as follows:

$$G(f) = \frac{2\sigma^2 a}{4a^2 + (2\pi f)^2}$$

Where $\sigma$ is the amplitude. In the high-frequency region (f>>a), the spectrum G(f) decreases at 6 dB/oct along with the frequency. A similar relationship also holds in the case of a stepwise waveform such as indicated by the broken line in FIG. 2, in which each amplitude is random and the mean square value is $\sigma^2$. This is believed to be a completely integrated waveform of the Poisson pulse. In practice, measurement of the power spectrum indicates that is attenuates at 6 dB/oct along with the frequency, as typically shown in FIG. 3. In FIG. 3, the curves A, E and C respectively indicate a portrait of a person, a picture of the entire body of a person and a distant view.

In picture information, a contour or outline attracts the man's most attention. This is also evident from the fact that a man sees a scene in terms of the mutual relation of boundaries of individual, independent objects. Mainly from the above facts, it is deduced that the high-frequency component of a picture results from discontinuity of differentiation in the neighborhood of the origin of the correlation function and that this is the most striking feature. The following will describe the multistage selective DPCM system of this invention under the condition of constant-speed scanning.

(1) Approximation by stepwise waveform (first stage)

Figure 2:
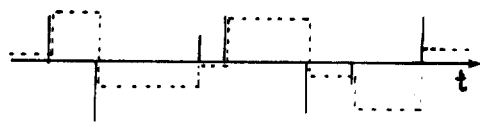
FIG. 2 is a diagram showing the integrated waveform of a Poisson pulse.
Figure 3:
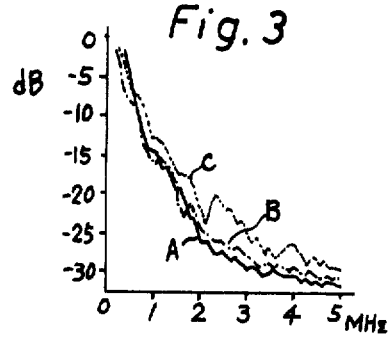
FIG. 3 is a characteristic diagram showing an example of an electric power spectrum.

Since it is believed that attenuation of frequency power spectrum of a picture signal at 6 dB/oct occurs because the signal is principally composed of such a waveform as shown in FIG. 2, it is the first-stage processing of the multistage selective DPCM of this invention is achieved by approximation of the input signal to a stepwise waveform from the standpoint of constant-speed scanning as follows:

The picture signal is divided into groups at every N picture elements, and the features forming a contour are sampled in the order of magnitude. This feature is evaluated by the absolute value of the level difference between adjacent picture elements. The constant-speed scanning is made possible by selecting n points from N successive picture elements in the order of the absolute value of the level difference and transmitting information of each of the points within a certain number of bits.

Figure 4:
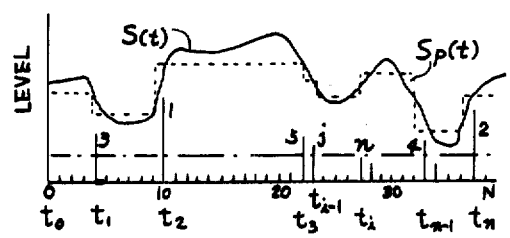
FIG. 4 is a time chart explanatory of a first-stage processing operation in this invention.

The above concept is shown in FIG. 4. In FIG. 4, the full line indicates a picture signal S(t), which is approximated to such a stepwise waveform $S_p(t)$ as indicated by the broken line. In the signal composed of N picture elements S(O) to S(N), the values $$|S(t) - S(t-1)| \text{ (where } 1 \leq t \leq N)$$

are arranged in the order of magnitude, and n points are selected in this order while their times are selected as follows:

$$t_0 \leq t_1 \leq t_2 \leq t_2 \leq \ldots t_n \leq t_N$$

Then, by transmitting the following time intervals:

$$T_i = t_i - t_{i-1}, \text{ (where } i = 1, 2, 3 \ldots N)$$

the points forming the contour can be transmitted. Each sampled point is coded into "0" or "1", "0" indicating that no feature is selected, and "1" further indicating that a level variation is selected. The notation $T_i$ indicates the duration of "0" between the points of "1". The coding is achieved by a coding method for the construction of minimum redundancy, such as the Huffman coding method as shown in Table 1. In this case, zero occurrence probability P(0)=0.76 is optimum. In Table 1, "$0^5$" indicate a sequence of consecutive five "00000".

| ORIGINAL BINARY SEQUENCE | CODE WORD |
|---|---|
| $0^5$ | 00 |
| 1 | 01 |
| 01 | 100 |
| 001 | 101 |
| 0001 | 110 |
| 00001 | 111 |

$T_i = 8$ indicates that "$0^5$ 001" follows the preceding bits "1", and this is coded into information "00101"; and $T_i = 12$ corresponds to "$0^5 0^5$ 01" and coded into "0000100". As mentioned above the number of bits necessary for coding each time interval $T_i$ is as follows:

If N=64 in a case where n=16, the number of bits is less than fifty-one bits. In an extreme case, there is a train of consecutive forty-six "0" accompanying with a train of consecutive eighteen "1" and three blocks of "01". In this case, $2 \times 9 + 3 + 2 \times 11 + 3 \times 3 = 52$ bits are sufficient for coding this train. Similarly, when n=12, forty-four bits will suffice.

Figure 5:
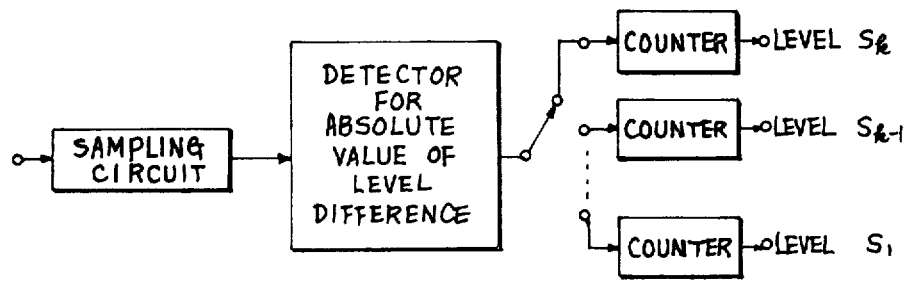
FIG. 5 is a block diagram illustrating a concrete example of an extractor of large level variation for use in the first-stage processing operation of this invention.
Figure 15:
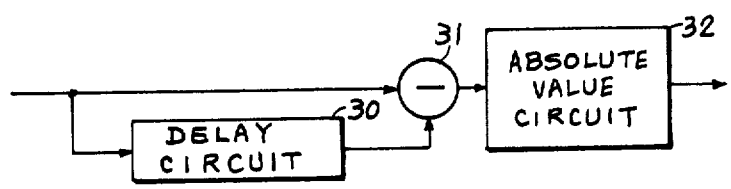
FIG. 15 is a block diagram illustrating an example of a detector employed in the extractor shown in FIG. 5.

In order to perform it by a real time system to arrange level variations in the order of the magnitude of absolute value and to select n points in the period of N points, it is necessary to effect the operation in a time substantially equal to N. In this case, a method called "radix sort" enables linear classification and, in this case, by a selective level extracting circuit using a detector such as shown in FIG. 5, the absolute value of the level variation is detected by the detector and accumulated on some threshold values $S_k$, $S_{k-1}$, ... $S_1$, as in the case of a pulse height analyzer, whereby to obtain a level corresponding to n. The detector for absolute value of level difference can be formed as shown in FIG. 15 by a delay circuit of one sampling period 30, a difference detector 31 and an absolute value circuit 32.

Next, the coding operation of $S(t_i)-S(t_{i-1})$ is also achieved in accordance with the Huffman coding method. A value $n=15.5\approx16$ is optimum corresponding to the entropy H(p) of zero occurence probability P(O)=0.76.

The value of an input represented by 8 bits or more is coded into 6 bits, and this coding is achieved as shown in Table 2, where the probability distribution of the level variation is used as an exponential function.

In this coding, bit allocation is based on the assumption that the probabilities of the absolute value of the level variation being less than 3, less than 7 and less than 15 are ½, ¾ and ⅞, respectively. In this case, the required number of bits is 4.5 bits on an average but 5 bits are necessary for representing the level variation in anticipation of an operation margin. However, since there is substantially no possibility of selecting +1, it is omitted.

| LEVEL CHANGE | CODE WORD | LEVEL CHANGE | CODE WORD | HEADER |
|---|---|---|---|---|
| 2 | 000 | −2 | 010 | 0 |
| 3 | 001 | −3 | 011 | |
| 4 | 10000 | −4 | 10100 | |
| 5 | 10001 | −5 | 10101 | |
| 6 | 10010 | −6 | 10110 | 10 |
| 7 | 10011 | −7 | 10111 | |

| LEVEL CHANGE | ± 8 ~ ± 1 5 (HEADER 1 1 0) |
|---|---|
| CODE WORD | 1 1 0 0 0 0 0 ~ 1 1 0 1 1 1 1 |
| LEVEL CHANGE | ± 1 6 ~ ± 3 2 (HEADER 1 1 1) |
| CODE WORD | 1 1 1 0 0 0 0 0 ~ 1 1 1 1 1 1 1 1 |

The time intervals between adjacent points of level variations and the level variation value are transmitted in pairs. For example, if $T_i=7$ and if $S(t_i)-S(t_{i-1})=13.4$, the data are transmitted in the form of 0010011000101.

In such a case, if the points of level variation are assumed to have the sharpest slope, when each of such points is positioned at a middle point of a sampling period, most of them can be each correctly expressed by level variations at two points.

Figure 6:
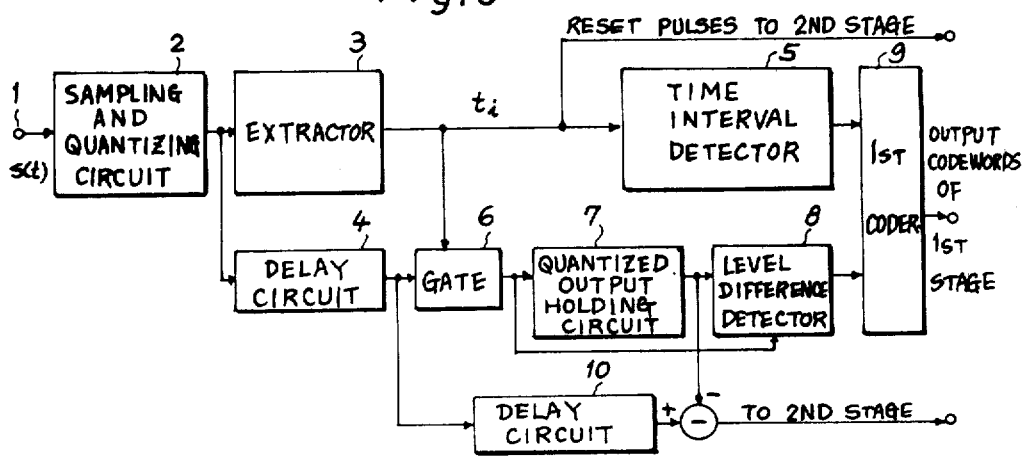
FIG. 6 is a block diagram showing a concrete example for executing the first-stage processing operation in this invention.
Figure 16:
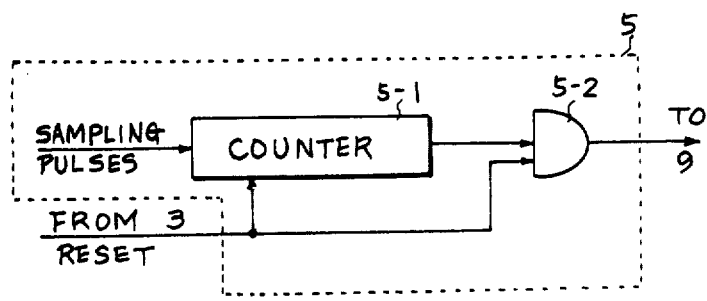
FIG. 16 is a block diagram illustrating an example of a time-interval detector employed in the example shown in FIG. 6.

The above is the processing operation of the first stage of the multistage selective DPCM system of this invention, by which the contour, which is the most striking feature, can be transmitted by a step-shaped waveform. A block diagram for such operation is illustrated in FIG. 6. In FIG. 6, such an input signal S(t) as shown at the top of FIG. 4 is sampled and quantized by a sampling and quantizing circuit 2 into a pulse train such as shown at the bottom of FIG. 4. The output pulses of the circuit 2 are applied to a extractor 3 of large level variations and a delay circuit 4. The extractor 3 selects a predetermined number of pulses, for instance, n pulses $P_{t1}$, $P_{t2}$, ... $P_{tn}$ from the pulse train 1, 2, ... N to provide gate pulses each corresponding to the timing $t_i$ of each pulse shown in FIG. 4. The sampled and quantized N pulses, delayed by the delay circuit 4 by substantially N picture elements, are selected by the gate pulses in a gate 6 and temporarily stored in a quantized output holding circuit 7 comprising a voltage hold circuit. A level difference between each output pulse of the quantized output holding circuit 7 and the immediately succeeding pulse is obtained by a level difference detector 8 such as a differential amplifier. Further, the time intervals of the output pulses of the selection level extractor 3 are detected by a time interval detector 5, which is formed as shown in FIG. 16 by a counter 5-1, used for counting sampling pulses from a sampling pulse generator (not shown) after resetting by each of the pulses from the extractor 3, and an AND gate for reading out the count of the counter 5-1 in response to each of the pulses from the extractor 3. The pulse time intervals detected by the time interval detector 5 and the pulse level difference detected by the level difference detector 8 are separately coded and then combined in a first encoder 9 to provide codewords by the first-stage processing. The output pulses indicative of a difference between the output of the delay circuit 10 and the output pulse of the quantized output holding circuit 7 are subjected to the second-stage and subsequent processing.

(2) Approximation for slant level change

As a result of studies of picture transmission by the orthogonal transfer, it has been recognized that slant orthogonal transform is substantially optimum, that the form of function of the optimum orthogonal transfer is not so much varied for the moving picture, and that the slant orthogonal transform improves S/N about 3 dB with the same number of bits, as compared with the Hadamard transform.

The above can be considered to indicate that there is no appreciable difference between the Hadamard orthogonal transform and the slant transform in the representation of the positional accuracy of the large level change point, that the slant orthogonal transform is more excellent than the Hadamard transfer in the ability of expression of the slant component, and that the indication of the slant component is of importance.

Figure 7:
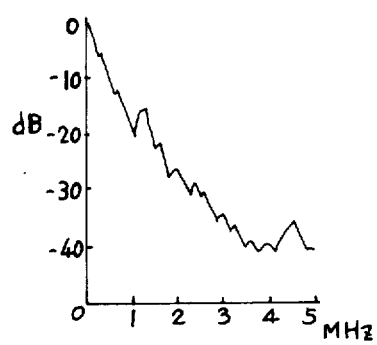
FIG. 7 is a diagram showing the power spectrum of residual components remaining after the removal of a stepwise waveform from an original signal.

Accordingly, most of the remainder provided after approximation to the contour portion by the step-shaped waveform are slope components and are considered to be further added with unselected contour portions of small level variations. The spectrum of the remainder obtained by subtracting the original signal from the stepwise waveform provided from the above-said first-stage processing operation attenuates at a rate of 8 to 12 dB/oct along with frequency, as shown in FIG. 7. A typical example of attenuation at a rate of 12 dB/oct along with the frequency is a double integral of a random poisson pulse process, and there is a trapezoidal wave as a wave whose envelope attenuates at a rate of 12 dB/oct. It is believed in that these are the principal part of the remainder. Moreover, it is considered that if an attenuation along with frequency is less than that at a rate of 12 dB/oct at a part, small contour portions of 16 dB/oct are mixed with the part. The above can be ascertained in an actual waveform. Such a property is a secondary feature of the original picture signal, which is masked by the primary property of the step-shaped waveform having a frequency attenuation characteristic of 6 dB/oct and does not appear in the primary property until the primary property is removed. Accordingly, the multistage processing is significant for the remainders, which are successively obtained by the operations of approximating to the processes indicative of statistical properties arranged in the order of magnitude.

In view of the above, the second-stage processing operation is required to be capable of following the slant of a waveform and approximating to level variations which are not so large and occur at times.

The $\Delta$ modulation and the $\Delta - \Sigma$ modulation are suitable for transmitting gentle-slant waveforms and provide a certain degree of approximation but cannot well follow relatively large level variations and abrupt changes of the slope. Consequently, it is necessary to adopt such a method that the variation width is dynamically changed and, if follow-up to the level variation has been completed, the unit variation width is shortened. The same is true of the $\Delta - \Sigma$ modulation method.

Figure 8:
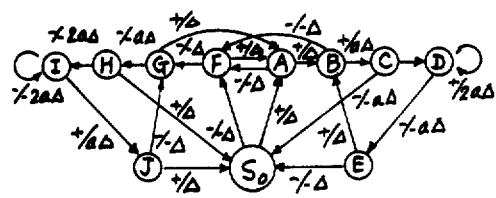
FIG. 8 is a state transition diagram illustrating an example of a dynamic Δ modulation system for use in a second-stage processing of this invention.

FIG. 8 is a state transition diagram of the dynamic $\Delta$ modulation system. The following up to a gentle slant waveform is achieved by moving among the states F, G, A and B. If a difference between the present value of a signal r(t), which is a difference between the value of the original signal and the approximated value obtained by the first-stage processing, and the output value of the preceding dynamic modulation has the plus sign, the operation proceeds in the direction of plus indicated by the arrow, by which a value shown under an oblique line is added to the preceding output value to obtain the present value. If the abovesaid difference has the minus sign, the operation proceeds in the direction of minus.

In each case of the states A and F, a linear operation takes place regardless of whether the difference has a sign of plus or minus. However, in the cases of the states B and G, if the difference signals has respectively signs of minus and plus, the operation returns to the states F and A belonging to the linear region, or when plus and minus difference signals have been applied in the cases of the states B and G, respectively, it is decided that this is not a gentle slope but a non-selected level variation or a steep slope, which cannot be followed up.

At a selected sampling point in the period including N picture elements extracted by the first-stage processing operation, an amplitude error is lower than a minimum quantizing level, so that the state of this point is returned to an initial state $S_0$ and the operation is started therefrom, ensuring to remove a residual error and to prevent the state in which a large variation width occurs at this point.

In a case where not a gentle slant but a level variation having a certain degree of magnitude occurs, the operation is brought out of the states G, F, A and E and the variation width is successively increased from the minimum variation width $\Delta$ to other widths $a\Delta$, $2a\Delta$ and $3a\Delta$.

For example, when the operation is in the state C and the amount of output predicted in the dynamic $\Delta$ modulation is $x_i$, if the output of the residual component in the first-stage processing operation at the next sampling point is larger than $x_i$, the operation shifts to the state D to produce a quantized output $2a\Delta$. On the other hand, if smaller, the operation shifts to the state $S_0$ to provide a quantized output $-a\Delta$.

When the distribution of the non-selected level variation is the exponential one and $na\Delta$ is chosen at present, if the probability that the larger level difference than $na\Delta$ corresponds to $\frac{1}{2}n$, a binary search method is suitable therefor.

The state transition diagram is designed so that if a difference between an actual level and a coded output becomes smaller, the operation is as close to its initial state as possible. The reason is that since the operation is the second-stage one, a variation following a certain level variation may be considered to be gradual. Values $\pm a^n \Delta$ may also be used in place of $\pm an\Delta$ and, if $a \geq 2$, this is suitable for use in a case where a large level variation or a steep slope exists.

When $a < 2$, it is suitable for use in a case where the level variation is limited to a certain range.

Many modifications may be derived from the state transition of such a dynamic $\Delta$ modulation system. The simplest one is such that when a level difference of a sign different from the preceding one, the operation is returned to its initial state. Even with this method, an appreciably dynamic effect can be obtained.

Figure 9A:
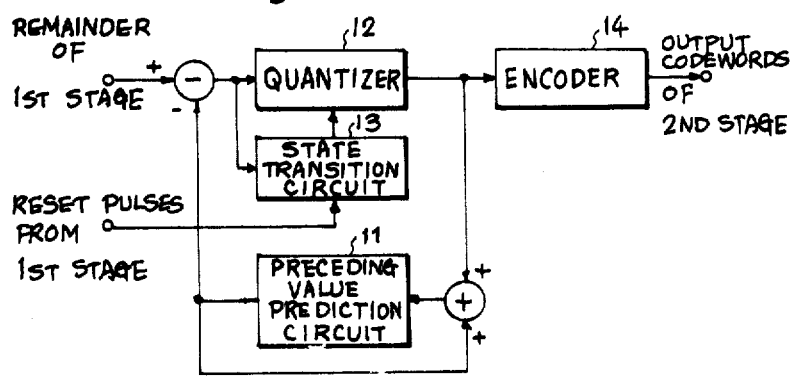
FIGS. 9A and 9B are block diagram each showing a concrete example for executing the second-stage processing in this invention.
Figure 10:
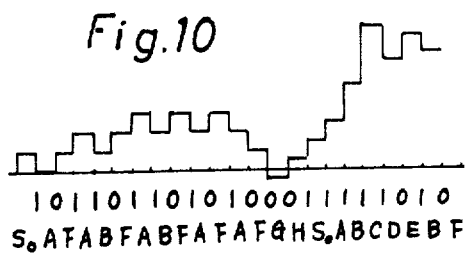
FIG. 10 is a time chart showing the follow-up characteristic of dynamic Δ modulation.

Such a second-stage processing follows the first-stage processing and is achieved with such a circuit construction as shown in FIG. 9A. This selects the state in a manner to minimize a transitional error in accordance with the statistic property of a picture, and then alters the variation width in accordance with the selected state. In the case of $a = 1.5$, such an operation as shown in FIG. 10 is performed.

In FIG. 9A, a difference between the output of a preceding value prediction circuit 11 and the residual component of the first-stage processing operation is applied to a quantizer 12 and a state transition circuit (i.e. a sequential logic circuit 13.) The quantizer 12 quantizes an input difference signal under the control of the sequential logic circuit 13 having transition states shown in FIG. 8 and supplies the quantized output to an encoder 14 of $\Delta$ modulation. The sum of the outputs of the circuits 12 and 11 is stored as the next predictive value of preceding value in the circuit 11 comprising a register. The encoder 14 produces code words of the second-stage operation from the quantized output of the quantizer 12.

In each period, values a and $\Delta$ are selected in accordance with the mean square value of an error resulting from the first-stage processing operation, and information $(a, \Delta)$ is classified with 2 to 3 bits to transmit at the beginning of each period, which gives a better approximation. Further, it is also possible to employ such a modification in which a secondary signal is successively divided into blocks of information for every two picture elements in place of setting up the state in the second-stage processing operation, so that if the level variation between the two picture elements, that is, the absolute value of a slope, is regarded as indicating a flat portion or a slope depending upon whether the abovesaid absolute value is smaller or larger than a certain value.

(3) Approximation using correlation between scanning lines or frames (third stage)

It can be considered that redundancy on one scanning line has been removed by the first- and second-stage processing operations and that the remaining error signal is white noise, and there does not exist any particular statistic property to be extracted.

Accordingly, the property which should be selected at the next third stage is high correlation of signals between adjacent scanning lines. The main causes of high correlation between adjacent scanning lines are that almost all positions having large level variation along adjacent scanning lines occur within a slight deviation of points and that the value of level variation is rather small. The differences between the value of the preceding scanning line used as a predictive value and the value of the present scanning line are composed of random pulses and gentle low-frequency components, or components having no correlation because of switching in a picture. This is classified by use of the mean square error.

From scanning line blocks which are composed of $N_3$ lines in which block signals are arranged in the order of magnitude of the mean square error relative to the preceding scanning line, $n_3$ blocks are picked up in the order of magnitude of the mean square error by the use of a line block selector 21 and, in connection with the selected blocks $n_3$, the first- and second-stage processing operations are achieved. In the remaining blocks $(N_3-n_3)$ of small error electric power, an error relative to the point selected on the preceding scanning line is very small. For the correction of this, in the case of a signal using "0" or "1" as the header, a corrected value at a sampling point immediately following or preceding the selected point on the preceding scanning line, shown in FIG. 11, is coded by the Hoffman coding method as in the case of Table 2. However, the coding method is such that in the case of "0", a code word of amplitude "0", that is, of no change, is added. After this, the second-stage processing is applied thereto and, for the signal value obtained as a result of those processings, the first-stage processing is applied to obtain the selected points. The corrected points are used for the comparison with the next scanning line.

Thus, in this case, the upper limit of the code length is defined by $n_3$ in the $N_3$ blocks, so that scanning of substantially constant speed is possible.

Alternatively, there is a scheme such that n points are chosen in the selected $n_3$ blocks including N picture elements among $N_3$ line blocks at the first stage of the multistage selective DPCM system and that $n_4$ points $(n_4 < n)$ are chosen in the unselected $(N_3-n_3)$ blocks from the first stage, while all blocks are applied to the second stage of the multistage selective DPCM system.

Figure 14:
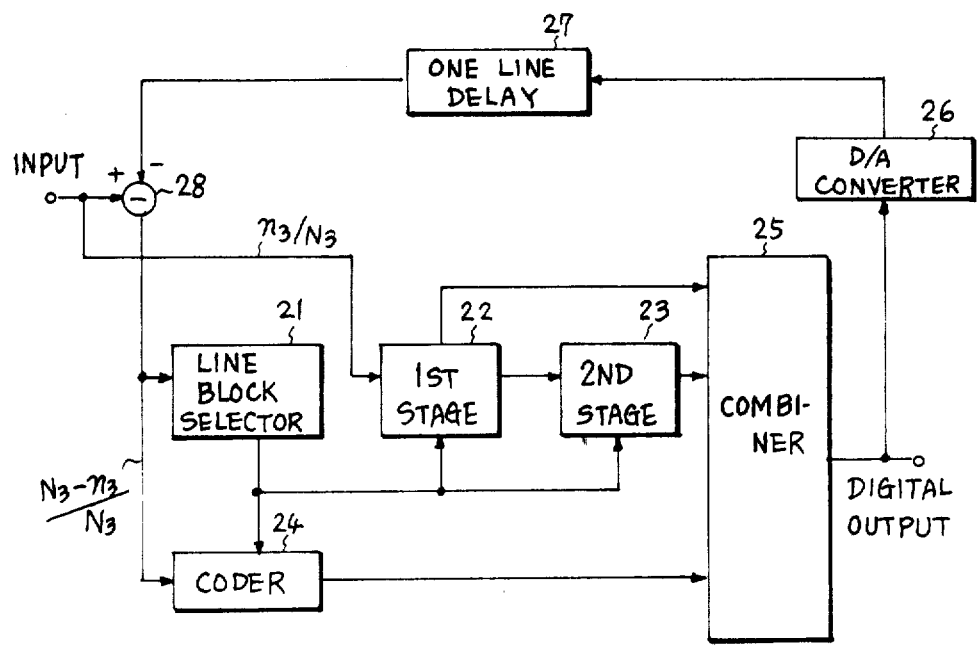
FIG. 14 is a block diagram illustrating an example of the third stage used in this invention.

An example of the third stage is shown in FIG. 14, in which a line block selector 21 selectively activates the first stage 22 and the second stage 23 mentioned above to process $n_3$ blocks from $N_3$ lines of the input signal. A coder 24 having the same circuit construction as that shown in FIG. 9A or 9B selectively codes $(N_3-n_3)$ blocks. Outputs of the stages 22, 23 and the coder 24 are applied to a combiner 25 to obtain an output digital signal. The digital output is converted to an analog signal substantially equal to the original signal by a digital-analog converter 26. The output of the converter 26 is applied to a subtractor 28 through a one-line delay 27. A mean square error of a difference between adjacent lines is obtained at the output of the subtractor 28 and applied to the selector 21 and the coder 24. The selector 21 is so formed to select $n_3$ lines having larger mean square differences from $N_3$ successive lines.

The same procedures can be used for interframe correlation.

Simulation is achieved by the A-D conversion of a luminance signal obtained from a flying spot scanner and by reading the converted signal in a computer.

In the flying spot scanner (FSS), the result of the A-D conversion is applied to a computer, such as NEAC 3200-50, through an FSS control device and a universal input device, and the output is connected to the FSS control device through a universal output device for the intensity modulation of a CRT. In this case, positions of spot are applied to the FSS control device from the computer. FIG. 12 is a block diagram of the computer for achieving the above simulation.

In accordance with data and a control signal from a computer, the output control section transmits the positional data of the spot to FSS and a luminance signal at its coordinates can be produced by a 12-bit D-A converter.

The scanning modes are (1) raster scanning and (2) random scanning, and have a boundary limiting function. This enables boundary setting with a register switch.

The input control section is to transfer the luminance signal to the computer while FSS is used and the luminance of the scanning CRT having A-D converters in two channels can be corrected. Further, the A-D converter has an overflow detecting function and enables a decision with a lamp and a program.

Figure 13:
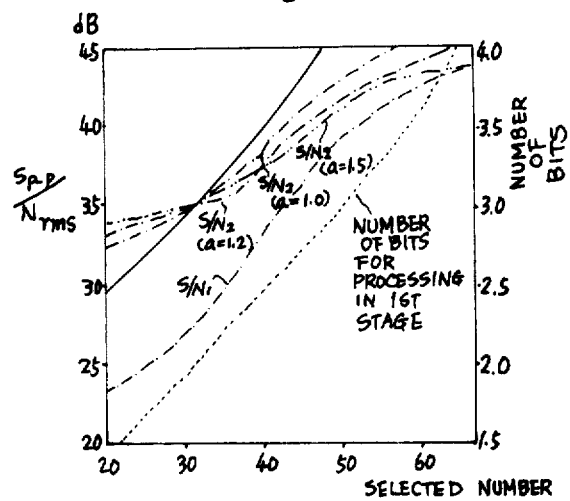
Figure 9B:
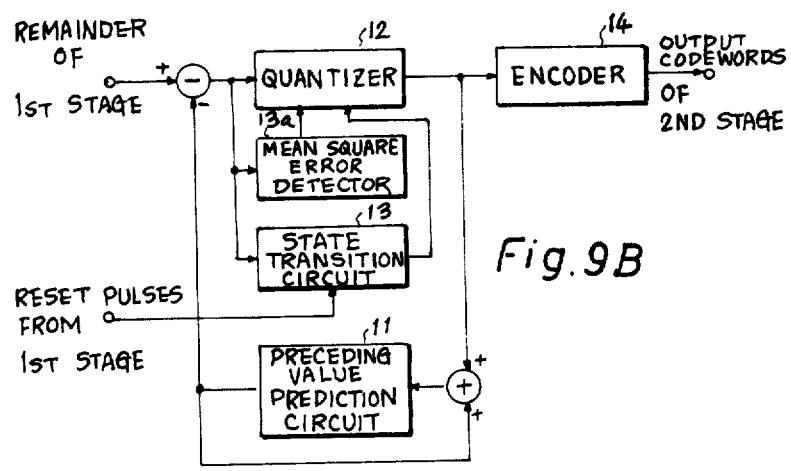

By FSS described above, a slide of a face used as a sample was cut off and simulation was achieved with $N_1 = 128$. In relation to the dynamic range, the part corresponding to 9 bits is caused to correspond to white and black levels in the computer, by which the luminance varies over substantially the entire amplitude range. The simulation program subjects such a picture signal to the first-stage processing of the multistage selective DPCM system. In this case, the minimum level interval is one corresponding to 6 bits PCM. A comparison operation of the result of simulation in the case of 6 bits PCM with that in the case of 7 bits indicates that the minimum level corresponding to 7 bits PCM is better by about 1 dB in S/N. A difference signal between a 9-bit luminance signal and the output resulting from the first-stage processing operation in the case of 6 bits PCM is subjected to the second-stage processing operation. To perform this, simulation was effected in connection with the ordinary $\Delta$ modulation, that is, the case of $a = 1.8$ in FIG. 8, and the cases of $\Delta = 1.0$ and $1.5$, with $a = 1.2, 1.5$ and $2.0$. A typical example of the results of simulation is shown in FIG. 13. However, since the results obtained with $\pm a^n \Delta$ are better than those with $\pm an\Delta$, the former is shown. The value $\Delta$ is classified into groups of the ratio S/N respectively being lower than 20 dB, 20 dB to 24 dB and higher than 24 dB, and the value a is set to be 1.5, 1.0 and 0.5, respectively. For this purpose, the circuit example shown in FIG. 9A can be modified as shown in FIG. 9B, in which a mean square error detector 13a, which is formed by a cascade connection of a square circuit and an average circuit, is provided to select a suitable value of $\Delta$ in the quantizer 12. As a result of this simulation when the number selected at the first stage is small, the S/N ratio has the decreasing tendency, but indicates the tendency of recovering S/N by using the value of a little larger than one. However, there is still the possibility of S/N being a little enhanced by adaptive changing a and $\Delta$ in each block. The S/N ratio obtained as described above is $S_{p-p}/N_{rms}$ which does not include a synchronizing signal portion, and the weighted signal to noise power ratio can be obtained by adding thereto about 14 dB. From this, a weighted signal to noise power ratio of about 50 dB can be obtained with 3 bits/picture element. The results of simulation shows that appreciably excellent S/N is obtained with a small number of points selected, and there exists the possibility of dividing the selective DPCM of the second stage into two parts.

The multistage selective DPCM of this invention is a method in which signals of the most striking feature are selected and are approximated by utilizing the following order feature, a feature of its difference signal is obtained so that it gives better signal approximation, and successive approximation to signals to thereby decrease redundancy. As a result of application of this concept to a picture signal, it has been found that good results can be obtained. The features of the system used are as follows:

(1) When a signal is compressed by the selective DPCM of the two-stage construction to 3 bits/picture element, weighted S/N of 50 dB is obtained to provide for appreciably excellent transmission performance.

(2) Constant-speed scanning is possible.

(3) Since a signal is divided into blocks, the influence of a bit error can be confined within each period.

What I claim is:

1. A multistage selective differential pulse code modulation system comprising:

a first encoding stage for receiving an input signal for approximating the input signal to a stepwise waveform having n level changes at sampling points selected in the order of level magnitude from a predetermined adjacent N samples in the input signal by developing a first coded output indicative of said stepwise waveform and a remainder corresponding to a difference between said input signal and said stepwise waveform;

a second encoding stage connected to said first stage for receiving said remainder to encode said remainder by delta modulation, which uses a variable step level controlled in accordance with the level variation feature of said remainder so as to provide a second coded output indicative of successive values of said variable step level of said delta modulation; and output means connected to said first stage and said second stage to send out said first coded output and said second coded output to indicate said input signal.

2. A multistage selective differential pulse code modulation system according to claim 1, further comprising a third stage, said third stage comprising selection means receptive to said input signal for selecting $n_3$ blocks in the order of level magnitude from $N_3$ line signals to apply said $n_3$ blocks to said first encoding stage, and an additional coder receptive of $(N_3-n_3)$ blocks for coding the $(N_3-n_3)$ blocks in accordance with Huffman coding method to produce a third coded output.

3. A multistage selective differential pulse code modulation system according to claim 1, in which said first encoding stage comprises a sampling and quantizing circuit for sampling and quantizing an input signal to develop a pulse train, an extractor connected to the output of the sampling and quantizing circuit for producing gate pulses successively corresponding to respective timings of large level pulses which are selected from the output pulse train of the sampling and quantizing circuit, a first delay circuit connected to the output of the sampling and quantizing circuit for delaying the pulse train by substantially N sampling periods to develop a delayed pulse train, a gate connected to the outputs of the extractor and the first delay circuit for gating the delayed pulse train by the gate pulses to develop a gated pulse train, a quantized output holding circuit connected to the output of the gate for temporarily storing the level of each pulse of the gated pulse train until the immediately succeeding pulse thereof to develop a stepwise waveform, a level difference detector connected to the output of the quantized output holding circuit for detecting a level difference between adjacent steps of the stepwise waveform to develop successive level differences, a time interval detector connected to the output of the extractor for detecting time intervals of successive pulses of the gated pulse train, a first coder connected to the output of the level difference detector end the time interval detector for producing said first coded output indicative of the detected time intervals and the detected level differences, and means connected to the output of said first delay circuit and the output of the quantized output holding circuit for providing said remainder.

4. A multistage selective differential pulse code modulation system according to claim 3, further comprising a third stage, said third stage comprising selection means receptive of said input signal for selecting $n_3$ blocks in the order of level magnitude from $N_3$ line signals to apply said $n_3$ blocks to said first encoding stage, and an additional coder receptive of $(N_3-n_3)$ blocks for coding the $(N_3-n_3)$ blocks in accordance with Huffman coding method to produce a third coded output.

5. A multistage selective differential pulse code modulation system according to claim 1, in which said second encoding stage comprises a first subtractor receptive of said remainder of said first encoding stage and of a predictive value of preceding value for producing a first difference between the remainder and the predictive value of preceding value, a state transition circuit receptive of said gate pulses from said first encoding stage and said first difference from the first subtractor for assuming one of predetermined states to indicate the level of said first difference from the subtractor in response to each of said gate pulses, a quantizer receptive of said first difference from the subtractor and connected to the state transition circuit for quantizing said difference by the use of dynamic quantization levels controlled in accordance with the states of the state transition circuit, an adder receptive of the output of the quantizer and said predictive value of preceding value for providing an addition output of the output of the quantizer and said predictive value of preceding value, a predictive value predicting circuit receptive of said addition output for producing the next value of said predictive value of predicting value, and a second coder receptive of the output of the quantizer for providing said second coded output.

6. A multistage selective differential pulse code modulation system according to claim 5, further comprising a mean square error detector receptive of said first difference for controlling the unit quantization level of said quantizer in accordance with the first difference.

* * * * *